United States Patent
Müller

(10) Patent No.: US 7,211,806 B2
(45) Date of Patent: May 1, 2007

(54) PARTICLE BEAM APPARATUS

(75) Inventor: Helmut Müller, Schwäbisch Gmünd (DE)

(73) Assignee: Carl Zeiss NTS GmbH, Oberkochen (DE)

(*) Notice: Subject to any disclaimer, the term of this patent is extended or adjusted under 35 U.S.C. 154(b) by 146 days.

(21) Appl. No.: 10/948,225

(22) Filed: Sep. 24, 2004

(65) Prior Publication Data
US 2005/0103997 A1 May 19, 2005

(30) Foreign Application Priority Data
Sep. 24, 2003 (DE) ................ 103 44 492

(51) Int. Cl.
*H01J 37/20* (2006.01)
(52) U.S. Cl. .................. 250/433.1; 250/311
(58) Field of Classification Search ........... 250/443.1, 250/433.1
See application file for complete search history.

(56) References Cited
U.S. PATENT DOCUMENTS

| | | | |
|---|---|---|---|
| 4,179,605 A | 12/1979 | Watanabe et al. | |
| 4,591,722 A * | 5/1986 | Biddlecombe et al. | ... 250/443.1 |
| 4,833,330 A | 5/1989 | Swann et al. | |
| 5,013,913 A | 5/1991 | Benner | |
| 5,077,637 A * | 12/1991 | Martorana et al. | .......... 361/717 |
| 6,447,964 B2 * | 9/2002 | Okino et al. | .................. 430/30 |
| 6,469,381 B1 | 10/2002 | Houle et al. | |
| 2004/0094710 A1 | 5/2004 | Muller et al. | |

\* cited by examiner

Primary Examiner—David A. Vanore
Assistant Examiner—Phillip A. Johnston
(74) Attorney, Agent, or Firm—Walter Ottesen

(57) ABSTRACT

A particle beam apparatus has a cooled anti-contaminator (18) and/or a cooled specimen holder (17). A thermal conductor (19) is provided for providing a connection between the anti-contaminator (18) and/or the specimen holder (17), on the one hand, and the cooler (21) of a cryogen vessel (20) on the other hand. The thermal conductor (19) includes a carbon fiber bundle. With the carbon fiber bundle (19a, 19b), a high thermal conductivity is ensured between the cooler (21) and the surface (17, 18) to be cooled. At the same time, thermal expansions are avoided which lead to a displacement of the anti-contaminator (18) and/or the specimen holder (17).

12 Claims, 2 Drawing Sheets

PARTICLE BEAM APPARATUS

CROSS REFERENCE TO RELATED APPLICATION

This application claims priority of German patent application no. 103 44 492.0, filed Sep. 24, 2003, the entire content of which is incorporated herein by reference.

FIELD OF THE INVENTION

The invention relates to a particle beam apparatus having a beam of charged particles, especially, particle beam apparatus such as transmission electron microscopes and raster electron microscopes. More specifically, the invention relates to particle beam apparatus of this kind with cooled components in proximity of a specimen to be accommodated.

BACKGROUND OF THE INVENTION

In electron microscopes, especially transmission electron microscopes, wherein a good vacuum is required in the region of the specimen which is to be microscoped, the problem occurs that substances, which outgas from the specimen, deteriorate the vacuum, that is, the vacuum becomes contaminated. In order to avoid such a contamination of the vacuum, so-called anti-contaminators can be mounted in the region of the specimen within the vacuum column with these anti-contaminators being cooled. Gases escaping from the specimen condense on the anti-contaminators because of the lower temperature of the anti-contaminators relative to the ambient temperature within the vacuum column whereby the quality of the vacuum is retained. The anti-contaminators operate to a certain extent as cryopumps. By maintaining the quality of the vacuum in the region of the specimen, a contamination of the specimen by residual gas molecules of the vacuum, which condense on the specimen, is simultaneously reduced whereby the specimen quality is maintained over a longer time.

Furthermore, it is also possible to provide coolable specimen manipulators via which the specimen can be cooled during the electron microscopic investigation. Cooled specimen manipulators operate likewise as anti-contaminators. Furthermore, the specimen can, in this way be held at a correspondingly low temperature during the electron microscopic investigation.

For cooling the anti-contaminators and/or the specimen holder, a cooler can be provided which is arranged outside of the vacuum system. The heat of the anti-contaminator and/or of the specimen holder is conducted to this cooler. Up to now, thermal conductors of copper or copper wires have been used for conducting heat away from the anti-contaminators and/or the specimen holder to the cooler. Copper has a high linear coefficient of expansion and therefore considerable shrinkages of the thermal conductor occur when there is a cooling to the temperature of the cooler, which, as a rule, is liquid nitrogen. These changes of length must be compensated by suitable elastic supports of the cooling rod and of the vessel filled with the cryogen. This is always accompanied with cooling losses which reduce the efficiency of the cooling. Furthermore, the thermal conductivity of the copper defines a resistance for the heat flow from the anti-contaminator and/or the specimen holder to the cooler. This resistance limits the minimum temperature which can be realized at the anti-contaminator and therefore the capacity thereof.

The following publications are noted as covering the state of the art in connection with the present invention and include: U.S. Pat. Nos. 4,179,605 and 4,833,330 as well as U.S. Pat. Nos. 4,591,722 and 6,469,381. U.S. Pat. No. 6,469,381 is not in the area of particle beam apparatus but is instead directed to the area of semiconductor component elements.

SUMMARY OF THE INVENTION

It is an object of the invention to provide a particle beam apparatus which avoids the disadvantages connected with the state of the art. It is another object of the invention to significantly increase the thermal conductivity between the anti-contaminator and/or the specimen holder on the one hand and the cooler on the other hand. A further object of the invention is to reduce the shrinkage of the thermal conductor during the cooling down thereof and to reduce the expansion of the thermal conductor associated with the heating thereof.

The particle beam apparatus of the invention includes: an objective for focusing or imaging the particle beam; a specimen holder for accommodating a specimen thereon in the objective or near the objective; a cooler; a thermal conductor for conducting heat away from the specimen holder to the cooler; and, the thermal conductor including a plurality of carbon fibers.

The particle beam apparatus of the invention includes an objective which focuses a particle beam or images the same. The particle beam apparatus includes a specimen holder on which a specimen is accommodated in the objective or in the proximity thereof. Furthermore, a cooler and a thermal conductor are provided. The thermal conductor functions to conduct away heat from the specimen holder or from cooling surfaces, which are arranged in the vicinity of the specimen holder, to the cooler. The thermal conductor includes carbon fibers.

With the use of carbon fibers as thermal conductors, a thermal conductivity, which is higher by approximately a factor of 3, is achieved compared to the use of copper as a thermal conductor. In this way, the thermal conductivity resistance is less by a factor of 3 with conditions otherwise the same compared to the use of copper rods as a thermal conductor. For this reason, a lower temperature can be reached at the cooling location, the cooling surfaces and/or the specimen holder. At the same time, the linear coefficient of thermal expansion of carbon fibers is very low compared to the linear coefficient of thermal expansion of copper. In this way, and with a suitable matching to the connecting geometry, a total expansion performance of approximately 0 can be achieved.

Carbon fiber material is present as fibers in its original form. For this reason, the connection between the cooler and cooling surfaces and/or the specimen holder can be manufactured from an elastic fiber bundle. In this way, the advantage is simultaneously achieved that almost any mechanical coupling between the cooler and the component to be cooled (especially, the transmission of sound and mechanical vibration) is virtually excluded.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
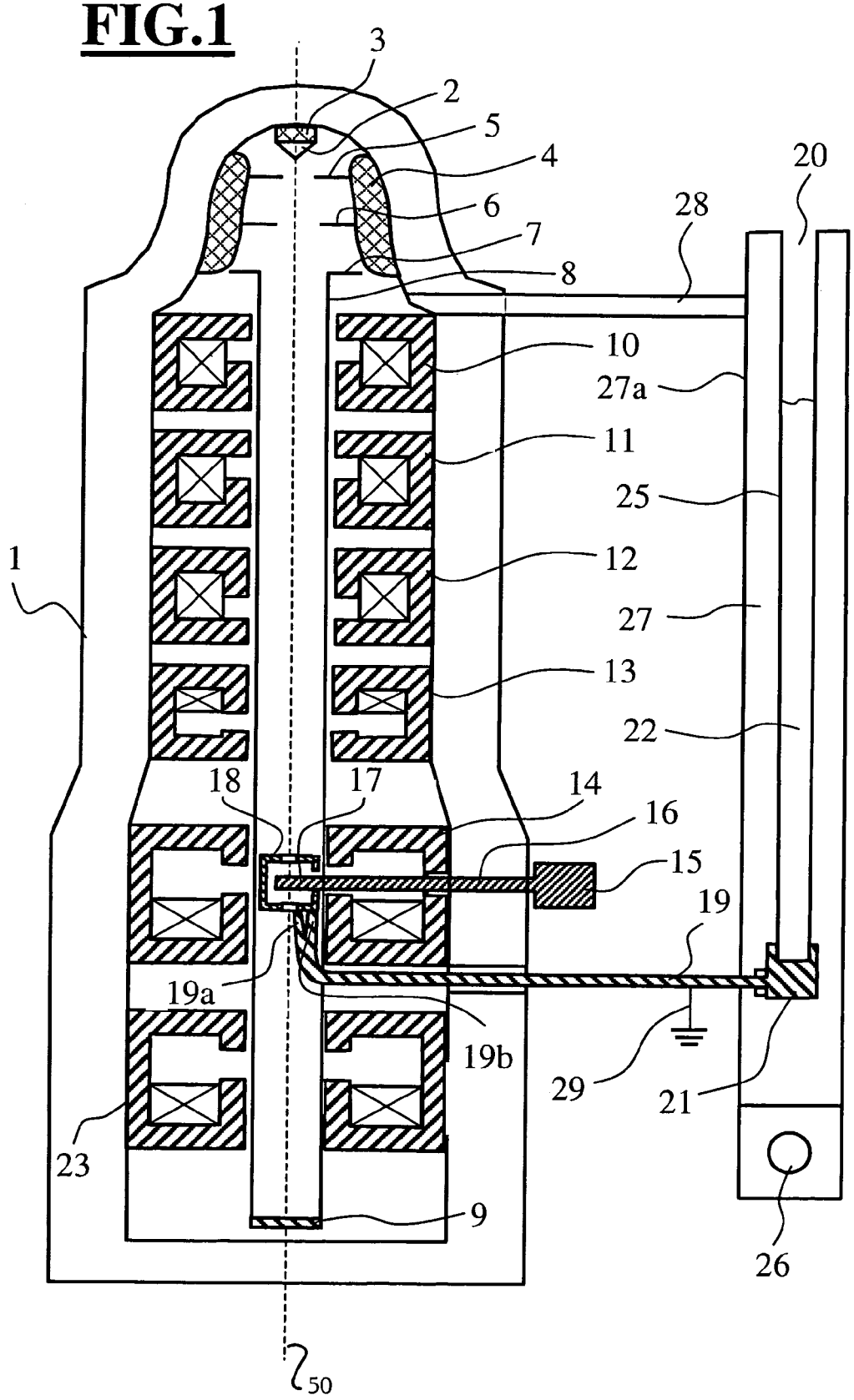
FIG. 1 is a schematic representation, in section, of a particle beam apparatus according to an embodiment of the invention in the form of a transmission electron microscope.

The particle beam apparatus in FIG. 1 includes a vacuum column 1 wherein the electron-optical components are mounted. In this embodiment, the electron-optical components include especially an electron source 2 which is accommodated on an insulator 3 within the vacuum column. Several accelerator electrodes (5, 6, 7) are mounted on a further insulator 4 within the vacuum column. The accelerator electrodes (5, 6, 7) are at a positive potential relative to the electron source 2. The electrode 7 is the farthest away from the electron source 2 and forms the anode which defines the end energy of the electron beam. The anode 7 is at a potential of 100 to 200 kV (if required, also 300 kV) higher relative to the electron source 2 and simultaneously lies at the potential of the vacuum column, that is, as a rule, at ground potential. The anode 7 is connected to a beam guide tube 8 which is electrically conducting. The beam guide tube 8 extends through the entire particle beam apparatus up to a detector 9 so that the anode potential is present from the anode 7 to the detector 9.

An electron-optical condenser system follows the anode 7 along the beam guide tube 8. In the embodiment shown, the condenser system includes four magnetic lenses (10, 11, 12, 13). With this multistage condenser system, the illumination aperture as well as the illuminated field of the electrons, which exit from the electron source 2, are variable as desired in a specimen plane because of corresponding changes of the excitation of the individual magnetic lenses (10, 11, 12, 13) over a wide range. Diaphragms (not shown) for defining the illuminating aperture and/or the illuminated field are provided in the beam path between the condenser lenses (10, 11, 12. 13). Here too, additional beam deflectors and/or multiple diaphragms can be mounted in the illumination system as shown, for example, in U.S. Pat. No. 5,013,913 incorporated herein by reference.

A condenser objective single-field lens 14 follows the multistage illumination system having magnetic lenses (10, 11, 12, 13). The condenser objective single-field lens 14 is, at the same time, the last condenser lens and functions as an objective lens. A specimen holder 17 on a specimen manipulator is accommodated through a bore through the pole shoe of the condenser objective single-field lens 14 at the elevation of the pole shoe gap. The specimen manipulator includes a manipulation rod 16 which is guided through the pole shoe of the condenser objective single-field lens 14 and also through the vacuum tube 1 and is movable from the outside via a manipulation simulator flange connected to the outside of the vacuum tube 1. The manipulation rod 16 is movable in three mutually perpendicular spatial directions parallel and perpendicular to the optical axis shown by broken line 50. A movement of the manipulator drives 15 is transmitted via a transfer rod 16 to the specimen holder 17. With respect to the configuration of a corresponding manipulator, reference can, for example, be made to United States patent publication 2004/0094710 incorporated herein by reference. A motoric drive and movement of the manipulator rod 16 is possible as an alternative to a manual specimen manipulation.

An anti-contaminator 18 is mounted within the beam guide tube 8 at the elevation to the pole shoe gap of the condenser objective single-field lens 14. The anti-contaminator 18 is comprised essentially of a more or less box-shaped housing which surrounds the specimen holder 17. The box-shaped housing has two holes, for example, bores, essentially coaxial to the optical axis for the passthrough of the electron beam. The anti-contaminator has additional openings essentially perpendicular and inclined to the optical axis. These openings are for the passthrough of the specimen holder 17 as well as for introducing detectors. The interior surfaces of the anti-contaminator 18 define cooling surfaces which ensure that molecules, which are contained In the residual gas of the vacuum, condense on the inner cooling surfaces of the anti-contaminator.

A one-stage or two-stage projective system 23 follows the condenser objective single-field lens 14. With the projective system 23, a specimen is imaged magnified on a detector 9, for example, a CCD camera sensitive for electrons. The specimen is accommodated on the specimen holder 17 and is illuminated via the multistage illumination system. The images, which are recorded by means of the CCD camera 9, can be presented on a display (not shown) or can be processed via an imaging processing unit (not shown) and stored.

Figure 2:
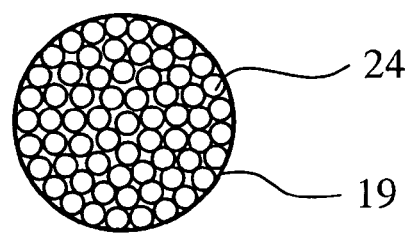
FIG. 2 is a section taken through the thermal conductor of FIG. 1 along the cutting plane II—II; and, FIG. 3 is a schematic representation, in section, of a particle beam apparatus according to another embodiment of the invention in the form of a raster electron microscope.

A cryogen vessel is provided for cooling the anti-contaminator 18 and the specimen holder 17 and is mounted outside of the vacuum column 1. The cryogen vessel includes an essentially cylindrical inner receptacle 20 which is configured for receiving liquid cryogen and can, for example, be filled with liquid nitrogen. In the base region, the inner receptacle 20 is surrounded by a cooler 21 which is in direct mechanical contact with the receptacle. The receptacle 20 is cooled by vaporizing cryogen. The cooler 21 is made of metal, for example, copper. A thermal conductor 19 of carbon fibers 24 is provided for thermal conduction between the cooler 21 and the specimen holder 17 and/or anti-contaminator 18. As the section view of FIG. 2 shows, the thermal conductor 19 includes a bundle of carbon fibers 24. The cooler 21 can, for example, be made as an aluminum cast part which is cast on one of the ends of the thermal conductor 19 so that a good thermal conduction is ensured between the thermal conductor 19 and the cooler 21.

The inner receptacle 20 is surrounded by an outer receptacle 27. The outer receptacle 27 is closed at the top; whereas, the inner vessel is open to the top for the exit of gas. The intermediate space between the walls 27a of the outer receptacle 27 and the walls 25 of the inner receptacle 20 is evacuated by a vacuum pump 26. Because of the vacuum between the inner receptacle 20 and the outer receptacle 27, there is a thermal insulation between the inner vessel and the outer vessel whereby a too rapid and useless vaporization of the cryogen is avoided.

In addition to cooling the cooler 21, the total assembly of the cryogen vessel has still another purpose because the total arrangement operates simultaneously as a cryogen pump. This is so for the reason that the residual gas, which is disposed between the inner and outer receptacles, condenses on the wall 25 of the inner receptacle. Because of the good vacuum achieved thereby in the intermediate space between the inner and outer receptacles, the cryogen pump formed in this manner is used to evacuate the space of the vacuum column 1 close to the electron source 2. For this purpose, a suction tube 28 connects the space of the vacuum column 1 close to the electron source 2 and the intermediate space between the inner and outer receptacles.

The thermal conductor 19 is passed through the vacuum tube 1 into the interior of the beam guide tube 8 and is subdivided directly ahead of the anti-contaminator 18 and the specimen holder 17 into two component bundles. One of the component bundles 19a is connected to the anti-contaminator 18 and functions for conducting away heat from the anti-contaminator 18 or for cooling the same and a second component bundle 19b is connected to the specimen holder 17 and functions to cool the specimen holder. The thermally good conducting connection between the thermal conductor 19 and the components, which are to be cooled, can take place in that a metal transition part is cast on the anti-contaminator end of the component bundle 19a of the thermal conductor and/or on the specimen holder end of the other component bundle 19b of the thermal conductor so that a full area contact is ensured between the ends of the carbon fibers of the thermal conductor 19 and the metallic transition part. The metallic transition part can be soldered to the component, which is to be cooled or can be fastened with threaded fasteners thereto.

With the good electrical conductivity of the carbon fibers of the thermal conductor, electrical charging effects in the region of the specimen and/or of the anti-contaminator are avoided. The thermal conductor 19 is grounded separately via a heavy earth ground 29.

The transmission electron microscope shown in FIG. 1 defines a particle beam apparatus having an objective 14 which focuses a particle beam. The apparatus includes a specimen holder 17 on which a specimen is accommodated in the objective 14. It furthermore includes a cooler 21 and a thermal conductor 19 which is connected to the cooler 21 and to the specimen holder 17 and to the anti-contaminator 18 whose surfaces define cooling surfaces so that the specimen holder and the anti-contaminator 18 are connected thermally-conductingly to the cooler 21. In this way, the thermal conductor 19 functions to conduct away heat from the specimen holder and away from the anti-contaminator to the cooler. The thermal conductor includes carbon fibers.

In order to ensure a good thermal coupling between the specimen holder and the anti-contaminator on the one hand and the cooler 21 on the other hand, the end faces of the carbon fibers 24 are connected form-tight to metal parts of the specimen holder 17, the anti-contaminator 18 and the cooler 21 or there are connecting parts provided which form-tightly surround the end faces of the carbon fibers and are connected in surface contact to metallic parts of the specimen holder 17, the anti-contaminator 18 and the cooler 21.

In the embodiment shown in FIG. 1, the specimen holder as well as the anti-contaminator are connected thermal conductively to the cooler 21 via the thermal conductor 19. However, it is also possible to cool either only the anti-contaminator 18 or only the specimen holder and to, correspondingly, provide a thermal conductor having carbon fibers only between the specimen holder 17 and the cooler 21 or alternatively, only between the anti-contaminator 18 and the cooler 21.

If a cooling of two or more components is required, then it is possible to subdivide a thermal conductor having carbon fibers into two or several component bundles (19a, 19b) in the region of the components to be cooled or to thermally-conductingly connect one component bundle 19a to one component to be cooled and a component bundle 19b to another component. Alternatively, it is also possible, however, to provide separate thermal conductors between each component, which is to be cooled, and the cooler 21. The last is especially utilized when the components, which are to be cooled, are spaced farther from one another.

In the embodiment of the invention shown in FIG 1, a receptacle 20, a Deward vessel, is provided for accommodating liquid cryogen and the cooler 21 is arranged in the receptacle. By filling the receptacle, for example with liquid nitrogen, an intense cooling of the anti-contaminator and/or of the specimen holder is possible with little technical complexity.

In the embodiment of the invention shown in FIG. 1, the receptacle 20, which functions to accommodate liquid cryogen, is mounted outside of the vacuum column and the thermal conductor 19 is passed into the vacuum column starting from the cooler 21. In this way, a very simple filling and refilling of the cryogen is possible. Furthermore, no special measures for removing the vaporized cryogen from the vacuum column are required. However, it is also possible to mount the receptacle within the vacuum column when suitable lines are additionally provided for conducting away the cryogen vapors. Furthermore, it is also possible to integrate the receptacle in the manipulator 15 of the specimen holder. In this case, the manipulation rod 16 can be configured as a tube and can accommodate the thermal conductor, which contains the carbon fibers, in its interior.

The thermal conductor of carbon fibers is preferably elastic and bendable. Furthermore, the thermal conductor 19 should not be under mechanical stress. In this way, the transfer of mechanical vibrations, which occur especially from vaporizing cryogen 22, is avoided.

Figure 3:
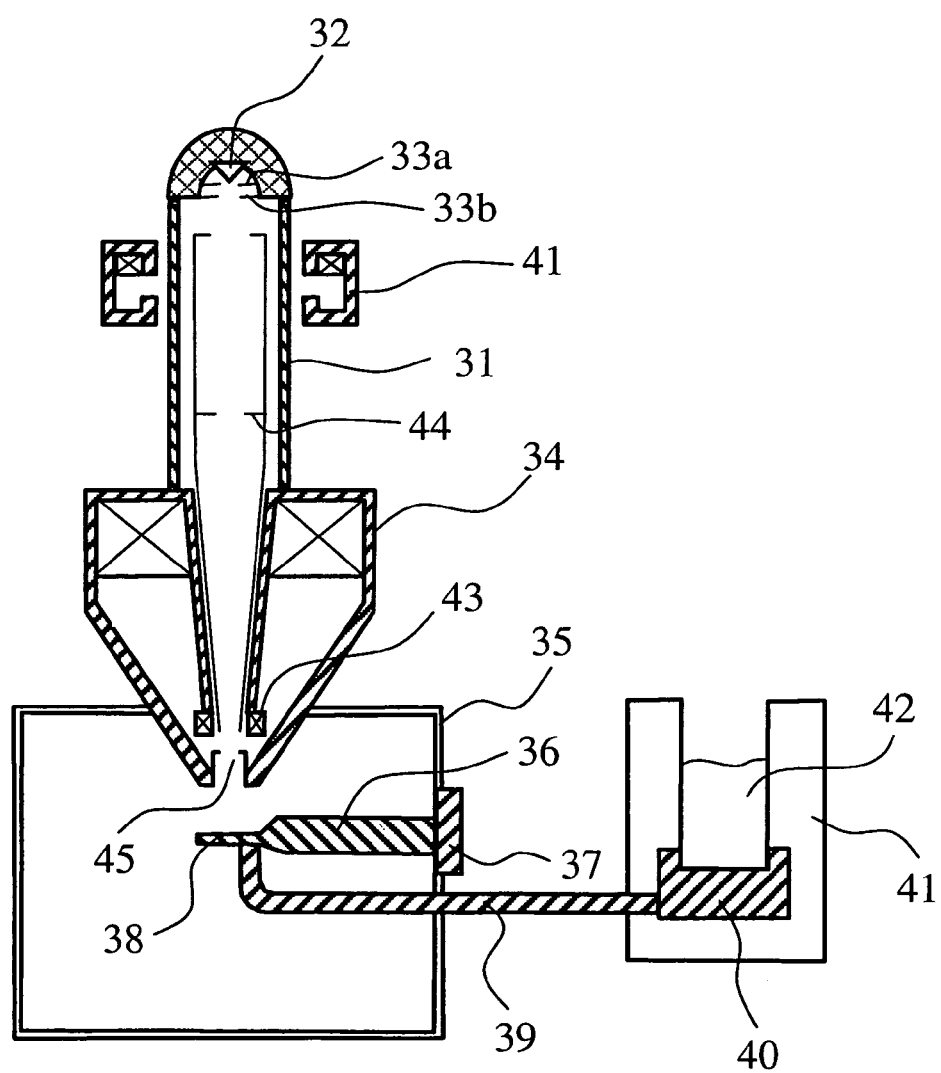

In the embodiment shown in FIG. 1, the anti-contaminator and the specimen holder 17 are mounted in the region of the pole shoe gap of the condenser objective single-field lens. Alternatively, it is possible, especially in raster electron microscopes, to arrange the anti-contaminator and/or the specimen holder 38 within a specimen chamber 35 as shown in FIG. 3. The anti-contaminator 18 and/or specimen holder 38 are mounted at the end of the objective lens 34 facing away from the electron source 32. The raster electron microscope in FIG. 3 likewise has an electron source 32 and several electrodes (33a, 33b) downstream thereof for accelerating the electrons leaving the electron source 32. A magnetic condenser lens 41 and an objective lens 34 follow the electrodes. The objective lens 34 can be a magnetic lens, an electrostatic lens or a combination of a magnetic and an electrostatic lens.

A specimen chamber 35 follows the objective lens and a specimen holder 38 is accommodated in the chamber 35 via a specimen manipulator 36. The specimen holder is displaceable in three mutually perpendicular directions via a drive 37 and can be tilted about an axis perpendicular to the optical axis of the electron optics (41, 34).

The electrons, which emanate from the electron source 32, are focused on the specimen by the objective 34. The specimen is accommodated on the specimen holder 38. The electron focus is deflectable perpendicularly to the optical axis by a deflection system 43 mounted in the objective lens 34 whereby the specimen can be scanned. In the interior of the electron optical column, pressure stage diaphragms (44, 45) are mounted via which the pressure in the specimen chamber can be varied while maintaining a constant vacuum in the region of the electron source. This is a so-called variable pressure SEM with which the specimen can be investigated also in a very poor vacuum in the specimen chamber.

A cooling of the specimen holder 38 is also provided in this embodiment. For this purpose, a Deward vessel 41, which is suitable for accommodating liquid cryogen, is again mounted outside of the specimen chamber. The wall of the Deward vessel, which surrounds the cryogen 42, is surrounded by a metal cooler 40 in the lower wall region. The cooler 40 is thermally-conductively connected via a thermal conductor 39 to the specimen holder 38. Here too, the thermal conductor 39 comprises a carbon fiber bundle. The thermally-conductive connection between the thermal conductor 39 and the cooler 40 as well as the specimen holder 38 is realized in the same way as in the embodiment of FIG. 1.

With the cooling of the specimen holder 38 and the specimen accommodated thereon, the condition is achieved that the water vapor, which emanates from the specimen, condenses again on the specimen and the specimen thereby approximately retains its water contents and the water vapor does not deteriorate the vacuum.

With the above embodiments, the invention was explained with respect to the example of an electron-optical apparatus. However, the invention is usable to the same extent also for apparatus wherein beams of positively charged charge carriers are used such as ions or positrons.

It is understood that the foregoing description is that of the preferred embodiments of the invention and that various changes and modifications may be made thereto without departing from the spirit and scope of the invention as defined in the appended claims.

What is claimed is:

1. A particle beam apparatus wherein a particle beam travels along an optical axis, the particle beam apparatus comprising:
   a vacuum column defining an interior;
   an objective for focusing or imaging said particle beam and said objective being disposed within said vacuum column;
   a specimen holder for accommodating a specimen thereon in said objective or near said objective and said specimen holder being disposed in said interior;
   a cooler of a cryogen vessel mounted outside of said vacuum column;
   a thermal conductor for conducting heat away from said specimen holder to said cooler;
   said thermal conductor including a plurality of carbon fibers; and,
   said thermal conductor extending from said cooler and passing through said vacuum column into said interior thereof.

2. The particle beam apparatus of claim 1, further comprising a receptacle for holding liquid cryogen; and, said cooler being mounted in or on said receptacle.

3. The particle beam apparatus of claim 1, wherein said thermal conductor comprises a bendable carbon fiber bundle.

4. The particle beam apparatus of claim 1, further comprising a particle beam source disposed on said optical axis; and, a single-stage illuminating system arranged along said axis and including a magnetic lens.

5. The particle beam apparatus of claim 1, further comprising a particle beam source disposed on said optical axis; and, a multi-stage illuminating system arranged along said axis and including a plurality of magnetic lenses.

6. The particle beam apparatus of claim 1, further comprising an anti-contaminator having cooling surfaces and said thermal conductor being divided into a first component thermal conductor connected to said cooling surfaces and a second component thermal conductor connected to said specimen holder.

7. A particle beam apparatus wherein a particle beam travels along an optical axis, the particle beam apparatus comprising:
   a vacuum column defining an interior;
   an objective for focusing or imaging said particle beam and said objective being disposed within said vacuum column;
   a specimen holder for accommodating a specimen thereon in said objective or near said objective and said specimen holder being disposed in said interior;
   a cooler of a cryogen vessel mounted outside of said vacuum column;
   a thermal conductor for conducting heat away from at least one of said specimen holder and said structure to said cooler;
   said thermal conductor including a plurality of carbon fibers; and,
   said thermal conductor extending from said cooler and passing through said vacuum column into said interior thereof.

8. The particle beam apparatus of claim 7, further comprising a receptacle for holding liquid cryogen; and, said cooler being mounted in or on said receptacle.

9. The particle beam apparatus of claim 7, wherein said thermal conductor comprises a bendable carbon fiber bundle.

10. The particle beam apparatus of claim 7, further comprising a particle beam source disposed on said optical axis; and, a single-stage illuminating system arranged along said axis and including a magnetic lens.

11. The particle beam apparatus of claim 7, further comprising a particle beam source disposed on said optical axis; and, a multi-stage illuminating system arranged along said axis and including a plurality of magnetic lenses.

12. The particle beam apparatus of claim 7, wherein said structure is an anti-contaminator having said cooling surfaces and said thermal conductor is divided into a first component thermal conductor connected to said cooling surfaces and a second component thermal conductor connected to said specimen holder.

* * * * *

UNITED STATES PATENT AND TRADEMARK OFFICE
CERTIFICATE OF CORRECTION

| | | |
|---|---|---|
| PATENT NO. | : 7,211,806 B2 | Page 1 of 1 |
| APPLICATION NO. | : 10/948225 | |
| DATED | : May 1, 2007 | |
| INVENTOR(S) | : Helmut Mueller | |

It is certified that error appears in the above-identified patent and that said Letters Patent is hereby corrected as shown below:

Column 1:
Line 46: delete "way" and substitute -- way, -- therefor.

Column 4:
Line 14: delete "In" and substitute -- in -- therefor.

Column 8:
Between lines 22 and 23: insert -- a structure defining cooling surfaces and being disposed in said interior of said vacuum column ; --.

Signed and Sealed this

Third Day of July, 2007

JON W. DUDAS
*Director of the United States Patent and Trademark Office*